(12) United States Patent
Becker

(10) Patent No.: US 12,298,202 B2
(45) Date of Patent: May 13, 2025

(54) METHOD FOR DETECTING INGRESS OF A VISCOUS MEDIUM IN AN ELECTRONIC ASSEMBLY FOR A VEHICLE

(71) Applicant: ZF Active Safety and Electronics US LLC, Livonia, MI (US)

(72) Inventor: Ingo Becker, Linnich (DE)

(73) Assignees: ZF ACTIVE SAFETY AND ELECTRONICS US LLC, Livonia, MI (US); ZF AUTOMOTIVE GERMANY GMBH, Alfdorf (DE)

( * ) Notice: Subject to any disclaimer, the term of this patent is extended or adjusted under 35 U.S.C. 154(b) by 328 days.

(21) Appl. No.: 17/797,299

(22) PCT Filed: Feb. 4, 2021

(86) PCT No.: PCT/EP2021/052617
§ 371 (c)(1),
(2) Date: Aug. 3, 2022

(87) PCT Pub. No.: WO2021/156341
PCT Pub. Date: Aug. 12, 2021

(65) Prior Publication Data
US 2023/0056076 A1    Feb. 23, 2023

(30) Foreign Application Priority Data
Feb. 7, 2020    (DE) .................... 10 2020 201 555.4

(51) Int. Cl.
*G01M 3/16*    (2006.01)
(52) U.S. Cl.
CPC .................... *G01M 3/16* (2013.01)
(58) Field of Classification Search
CPC ............................................. G01M 3/16–188
See application file for complete search history.

(56) References Cited

U.S. PATENT DOCUMENTS

| 5,540,085 A * | 7/1996 | Sakata ................ G01M 3/16 73/40 |
| 2010/0033883 A1* | 2/2010 | Simon ................ H02H 5/083 361/52 |
| 2019/0237963 A1* | 8/2019 | Wuerstlein ............ G01M 3/16 |

FOREIGN PATENT DOCUMENTS

| DE | 102012219151 A1 | 5/2013 |
| DE | 102016212986 A1 | 1/2018 |

(Continued)

OTHER PUBLICATIONS

German Search Report for corresponding German Application Serial No. 10 2020 201 555.4, dated Dec. 17, 2020, pp. 1-12.

(Continued)

*Primary Examiner* — Nathaniel J Kolb
(74) *Attorney, Agent, or Firm* — Tarolli, Sundheim, Covell & Tummino LLP

(57) ABSTRACT

The invention relates to a method for identifying infiltration of a viscous medium (18) into an electronic assembly (10) for a vehicle, the electronic assembly (10) comprising at least one housing (40), a printed circuit board (15) and a connection region (45), the housing (40) providing an almost tight enclosure for the electronic assembly (10) and a redundancy being provided in respect of a processing and/or forwarding of electrical signals by means of the printed circuit board (15) in the electronic assembly (10), the redundancy providing at least a first transmission path (1) and a second transmission path (2) operatively parallel thereto, each transmission path (1; 2) consisting of at least one first electrical conductor (11; 21) and a second electrical conductor (12; 22), the electrical conductors (11, 12; 21, 22) each being electrically insulated from one another, and the first transmission path (1) and the second transmission path (2) forwarding the same electrical signal (U), the second transmission path (2) providing a region (30), the first (Continued)

electrical conductor (21) and the associated second electrical conductor (22) having no insulation in this region (30), so that an electrical signal (U) which is conducted by the two electrical conductors (11; 12; 21; 22) is changed to an electrical signal (Uv) in the event that the viscous medium (18) infiltrates into the electrical assembly (10).

18 Claims, 3 Drawing Sheets

(56) References Cited

FOREIGN PATENT DOCUMENTS

| | | |
|---|---|---|
| DE | 102017222845 A1 | 6/2019 |
| DE | 102018201421 A1 | 8/2019 |
| DE | 102018219370 B3 | 10/2019 |
| JP | H07270108 A | 10/1995 |
| JP | H09109876 A | 4/1997 |
| JP | 2018507812 A | 3/2018 |
| JP | 2019106885 A | 6/2019 |

OTHER PUBLICATIONS

PCT International Search Report for corresponding International Application Serial No. PCT/EP2021/052617, mailed May 3, 2021, pp. 1-5.

Japanese Office Action for corresponding Japanese Application Serial No. 2022-547084, dated Dec. 19, 2024, pp. 1-6.

\* cited by examiner

METHOD FOR DETECTING INGRESS OF A VISCOUS MEDIUM IN AN ELECTRONIC ASSEMBLY FOR A VEHICLE

RELATED APPLICATIONS

This application is a U.S. National Stage Application filed under 35 USC 371, claiming priority to Ser. No. PCT/EP2021/052617, filed on 4 Feb. 2021; which claims priority from German Patent Application DE 10 2020 201 555.4, filed on 7 Feb. 2020, the entireties of which are hereby incorporated herein by reference.

TECHNICAL FIELD

The present invention relates to a method for detecting ingress of a viscous medium in an electronic assembly for a vehicle, and to the structure thereof.

BACKGROUND

The electronic assembly is intended to transmit and/or to process electrical signals. Redundancy is at least provided for the transmission of the electrical signals. This means that at least two transmission paths are present for an electrical signal. Such redundant arrangements are known in electronic assemblies.

If, for example, moisture or another viscous medium now gets into the electronic assembly, the electronic assembly may fail even if redundancy is present. If the electronic assembly is connected to a safety-related component such as steering, brakes, radar systems or lidar system of the vehicle, for instance a passenger car or commercial vehicle, and fails, accidents can occur. Also in the case of vehicles that are partially or even fully autonomous, failure of said electronic assembly can lead to accidents and personal injury.

Before the ingress of moisture or another viscous medium results in failure of the electronic assembly, it is advantageous to detect that ingress of moisture or another viscous medium has occurred in order to be able to take precautions in good time to prevent damage caused by complete failure of the electronic assembly.

It is also the aim here that ingress of moisture or another viscous medium into the electronic assembly can be detected using the existing components, i.e. without an additional sensor.

SUMMARY

The object of the present invention is therefore to provide a method for detecting ingress of a viscous medium in an electronic assembly, which method uses the existing components as far as possible, and the electronic assembly functions reliably after detection of a viscous medium at least over a certain period of time.

This object is achieved by a method for detecting ingress of a viscous medium into an electronic assembly for a vehicle, which electronic assembly comprises at least a housing, a printed circuit board and a connection region, which housing provides an almost tight enclosure for the electronic assembly, with redundancy being provided with regard to processing and/or transfer of electrical signals by means of the printed circuit board in the electronic assembly, which redundancy provides at least a first transmission path and a second transmission path, which is operatively parallel thereto, each transmission path consisting of at least a first electrical conductor and a second electrical conductor, which electrical conductors are electrically insulated from each other, wherein the first transmission path and the second transmission path transfer an identical electrical signal (U), wherein the second transmission path provides a region, in which region the first electrical conductor and the associated second electrical conductor have no insulation, and therefore in the event of ingress of the viscous medium into the electronic assembly, an electrical signal (U) that is being conducted by the two electrical conductors is modified to an electrical signal (Uv), wherein, in addition, said modified signal (Uv) of the second transmission path is compared with the electrical signal (U) of the first transmission path, and a warning message (W) is produced if the one electrical signal (U) differs from the modified electrical signal (Uv).

Said electronic assembly is enclosed for protection primarily by the housing made of, for example, a plastic or metal for protection against external influences. There is, however, primarily at least one connection region on the housing, for instance a plug-in connection or a cable output, in order to connect the electronic assembly to other components. This connection region constitutes an interface to the housing. This interface is designed especially to prevent ingress of moisture or another viscous medium into the housing and thus into the electronic assembly. The interface may start to leak, however, resulting in ingress of moisture or another viscous medium. If this is the case, said second transmission path is positioned in relation to the first transmission path such that the penetrating moisture or another viscous medium first reaches the region of the second transmission path at which the first and second electrical conductors are not insulated and together form a bridging point. The penetrated moisture or the other viscous medium now produces a short-circuit between the first and second electrical conductors, with the result that the electrical signal U to be transmitted in the second transmission path is modified to a modified signal Uv. Now the modified signal Uv is compared with the electrical signal U of the redundant first transmission path. If the two electrical signals are different, the aforementioned warning signal is produced, which can, for example, be indicated to a driver of the vehicle as a warning to visit a garage immediately. In the case of a fully autonomous vehicle, this warning signal can also be used to bring the vehicle into a safe driving condition or even immediately to a standstill. The consequences of the warning signal are intended only as examples and not in a definitive sense.

It can also be provided that the first transmission path is offset in parallel with, and/or at an angle to, the second transmission path. Said offset of the second transmission path in relation to the first transmission path must be selected such that in the event of ingress of moisture or a viscous medium, contact is always made first with the region of the second transmission path in which the first and second electrical conductors are not insulated and together form a bridging point. It must also be taken into account here whether the penetrating moisture or the viscous medium can, or will, find ingress into the housing, and hence into the electronic assembly, in the form of spray or drips or upwards travel, for instance.

As already mentioned, the first and second electrical conductors of the second transmission path can provide at the region a bridging point in order to speed up a change in electrical signal caused by moisture or a viscous medium, for example as a result of a short-circuit.

The bridging point can be formed by the first and second electrical conductors. This can be provided already on the printed circuit board.

The bridging point can also be formed by a first test point and a second test point, with the first test point connected to the first electrical conductor in an electrically conducting manner, and the second test point connected to the second electrical conductor in an electrically conducting manner. Said test points are already present on printed circuits, for instance in order to be able to measure electrical circuits.

It can also be advantageous that the electrical conductors are conductor tracks on the printed circuit board and/or electrical cables and/or plug-in contacts located inside the housing and/or in the connection region.

It may also be the case that the connection region comprises at least one electrically conducting connection in order to connect the electronic assembly to a further electrical and/or electronic assembly. The further electrical/electronic assemblies can be, for example, a steering assembly, or a brake, or a radar system or a lidar system.

The electrically conducting connection can also be designed as a current-conducting cable or as a plug-in connection.

It can also be advantageous that the redundancy provides at least a third transmission path, which third transmission path provides at least a first electrical conductor and a second electrical conductor, with the third transmission path provided between the first transmission path and the second transmission path.

The third transmission path can be similar in design to the second transmission path, with the following provided in the event of ingress of the viscous medium into the electronic assembly:
a) if there is further ingress of a viscous medium into the electronic assembly, then in the third transmission path, the viscous medium modifies the electrical signal (U) in the region into an electrical signal (Uv');
b) comparison with the electrical signal (U) in the first transmission path;
c) if (U)≠(Uv'), an additional warning signal (W') is produced.

The viscous medium may be water and/or an oil and/or an emulsion and/or a lubricant and/or a cleaning agent and/or an acid and/or a hydraulic fluid.

As already mentioned, the further electrical/electronic assembly may be a steering assembly or a wheel brake or a radar assembly or a lidar assembly or an assembly related to the safety of a vehicle operation.

BRIEF DESCRIPTION OF THE DRAWINGS

The invention is described in greater detail below by way of example with reference to figures, in which.

DESCRIPTION

Figure 1:
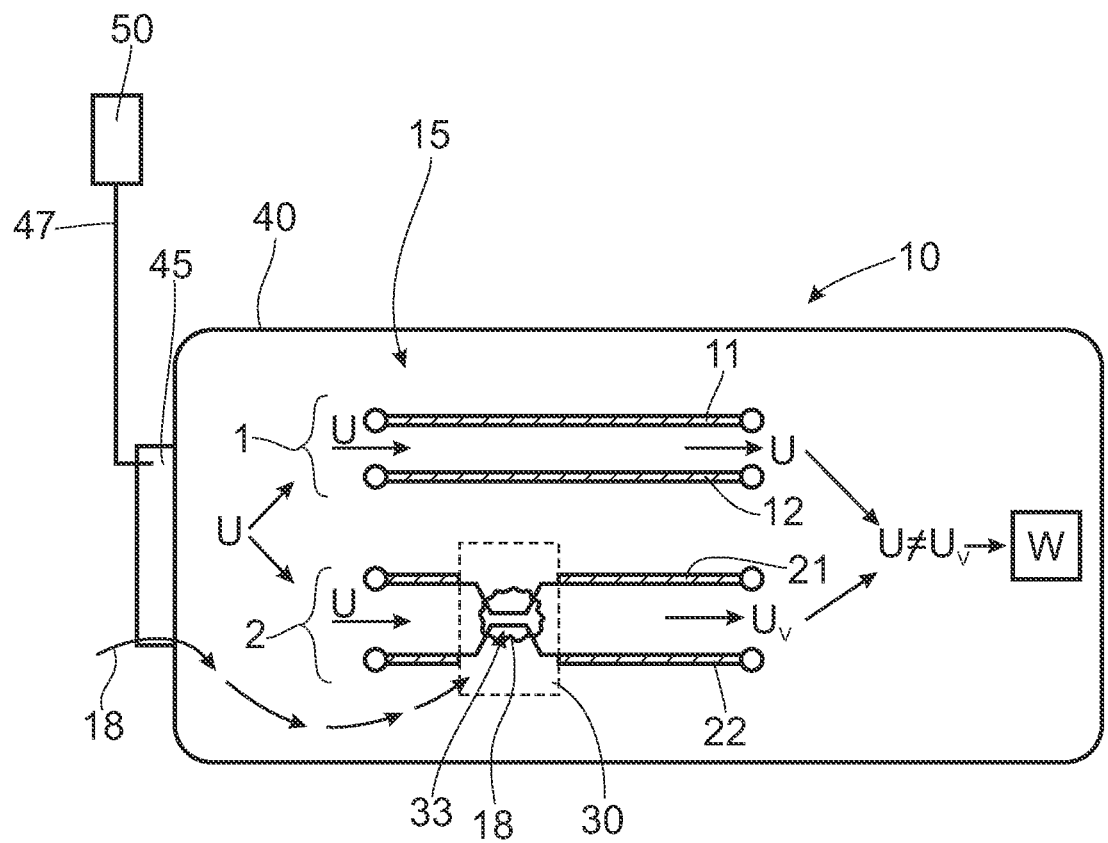
FIG. 1 shows a structure according to the invention including method for detecting moisture in an electronic assembly.

FIG. 1 shows an electronic assembly 10, which electronic assembly 10 is enclosed by a housing 40. The primary purpose of the housing 40 is to protect the electronic assembly from, for example, moisture or further external influences. The housing 40 provides a connection region 45. The electronic assembly 10 can be connected by means of this connection region 45 to a further electrical or electronic assembly 50, for example, which in turn can be connected by a connection 47. For instance this may involve a known plug connection located on the housing 40. At least one printed circuit board 15 is located in the housing 40. Said printed circuit board 15 provides at least a first transmission path 1 and a second transmission path 2 for processing and transferring electronic signals. Each transmission path is embodied at least as a first electrical conductor 11, 21 and a second electrical conductor 12, 22. It should be mentioned here that the first transmission path 1 and the second transmission path 2 each transfer or transmit an identical electrical signal U. Each transmission path acts as the redundant transmission path to the other. In addition, the electrical conductors 11, 12 and 21, 22 are insulated with respect to one another. It should be mentioned here that the insulation can be implemented by all known embodiments; for example an insulation layer does not necessarily have to be present. For instance, it is sufficient for the electrical conductors to be spaced apart from each other. A region 30 is additionally provided here on the second transmission path 2, in which region 30 the electrical conductors 21 and 22 have no insulation and here preferably have additionally a bridging point 33. Said bridging point 33 is designed such that the two electrical conductors 21 and 22 are spaced closer to one another than outside the region 30. It should also be mentioned here that the second transmission path 2 is arranged inside the housing 40 such that, in the event that ingress of a viscous medium into the housing 40 is possible, the viscous medium gets to the region 30 of the second transmission path 2 first before it can reach further electrical or electronic components inside the housing 40. In the embodiment of FIG. 1 mentioned here, the connection region 45, for example, may be a potential site for the ingress of a viscous material. Said viscous medium may be almost any type of fluid, or, for example, water and/or an oil and/or an emulsion and/or a lubricant and/or a cleaning agent and/or an acid and/or a hydraulic fluid. It should be mentioned here that these cited viscous media are merely examples. It should also be mentioned here that the electronic assembly may also be exposed to spray water, depending on its arrangement in the vehicle.

The method for detecting ingress of a viscous medium into the electronic assembly shall be described in greater detail below. As already mentioned, the first transmission path 1 and the second transmission path 2 are intended as redundant transmission paths for electronic or electrical signals. This means that the same electrical/electronic signals are transferred both via the first transmission path 1 and via the second transmission path 2. In this case, an electrical signal is transmitted both via the first transmission path 1 and via the second transmission path 2. In the event that, for instance in the region of the connection region 45, a viscous medium penetrates into the housing 40, the penetrating viscous medium 18 will first reach the region 30 of the second transmission path 2. If the viscous medium reaches the uninsulated electrical conductors 21 and 22 in the region 30, which conductors are spaced at a small distance from one another here, then the viscous medium 18 produces at the bridging point 33 a short-circuit between the first electrical conductor 21 and the second electrical conductor 22. In this case, the electrical signal U is not delivered further as the signal U, but instead the short-circuit modifies the electrical signal U into a modified electrical signal Uv. The first transmission path 1 continues to transmit the electrical signal U in unmodified form, with the signal U still present at the end of the first transmission path. The delivered signals are compared at the end of the two transmission paths 1 and 2. Since the electrical signal U is delivered at the end of the first transmission path 1, and the electrical signal Uv is delivered at the end of the second transmission path 2, it is detected that a change in the electrical signal has occurred in the redundant transmission path, in this case the second transmission path 2. A warning signal W is produced if the electrical signal U does not equal the modified electrical signal Uv. By virtue of this method for detecting ingress of a viscous medium into an electronic assembly, it is possible to detect by means of existing components if there is ingress of a viscous medium. The warning message produced in the event of ingress of a viscous medium in an electronic assembly can be used to store a warning for a driver of the vehicle or in the vehicle itself that moisture has penetrated into a safety-related component, for instance, and a visit to a garage is needed at this point. It is important, however, that the redundant path continues to guarantee the function of the electronic assembly. It should be mentioned here for the sake of completeness that, for instance, there may be a connection between the electronic assembly 10 and electrical steering or, for example, even an electrical braking system for a vehicle, in which case this method allows early detection of ingress of a viscous medium into the electronic assembly before failure of the electronic assembly occurs. Thus it can be indicated to the driver or the system that in this case failure of a safety-related system may be likely.

Figure 2:
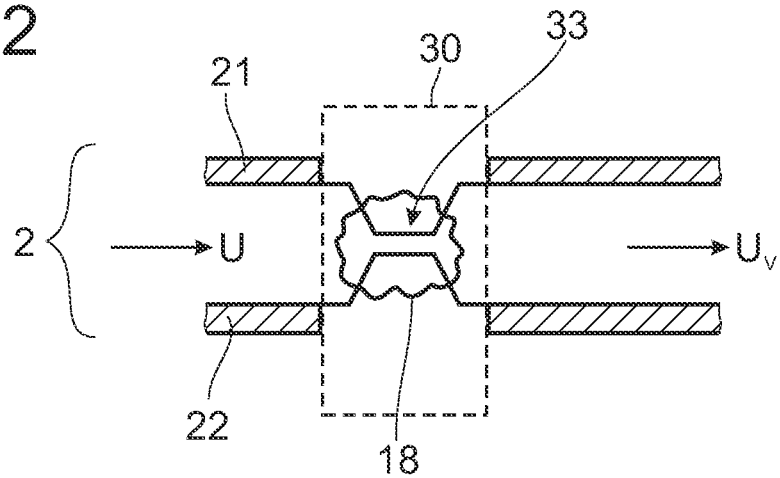
FIG. 2 shows a variant according to the invention.
Figure 3:
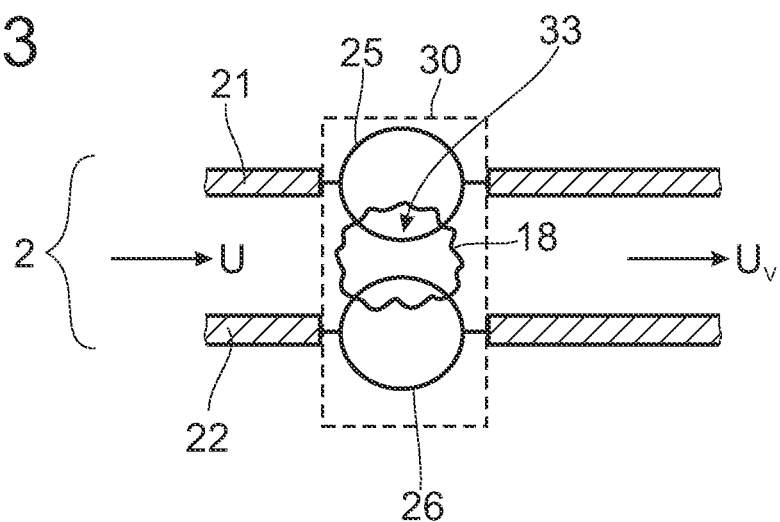
FIG. 3 shows a variant according to the invention.
Figure 4:
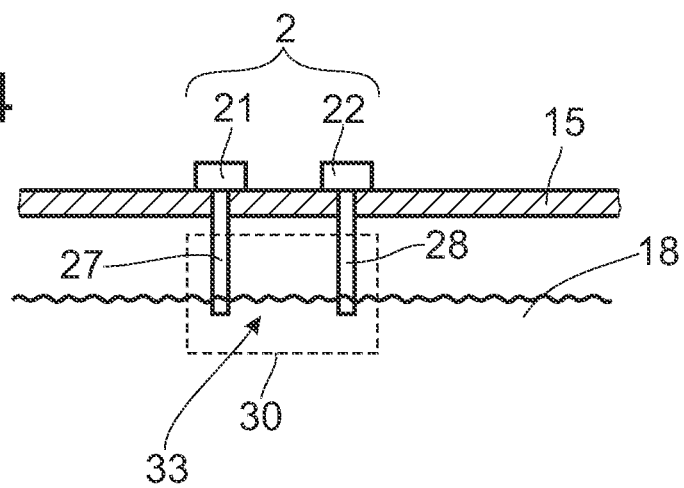
FIG. 4 shows a variant according to the invention.

FIGS. 2, 3 and 4 show invention-related embodiments of the bridging point 33 at which detection of a viscous medium takes place. FIG. 2 shows a region 30 having a bridging point 33, as already described and also shown in FIG. 1. It should be mentioned again at this point that the first and second electrical conductors 21 and 22 here in the region 30 and especially at the bridging point 33 are not insulated, and therefore the viscous medium penetrating from outside can come into contact with the electrical conductors. In order to guarantee the transmission path reliably in the absence of a viscous medium 18, it must be provided that the first and second electrical conductors do not come into contact even in the region 30. To still ensure rapid detection of a viscous medium, however, the first and second electrical conductors 21, 22 are spaced as closely as possible to each other in the region 30. If now, as already mentioned, the viscous medium encounters the bridging point 33, then the viscous medium 18 makes an electrical connection between the first electrical conductor 21 and the second electrical conductor 22, whereby the electrical signal U to be transmitted is modified into an electrical signal Uv.

FIG. 3 shows a further exemplary embodiment of the bridging point 33 of the region 30 between the first electrical conductor 21 and the second electrical conductor 22. In this case, what is known as a test point 25, 26 is provided for each of the two electrical conductors 21, 22 in the region 30. These test points 25, 26 are known on printed circuit boards, for instance for checking electrical circuits. It is also possible here, however, to use this test point 25, 26 as well to provide a bridging point 33. If now, as described in FIG. 2 and in FIG. 1, a viscous medium 18 reaches the bridging point 33, then the viscous medium 18 produces an electrical connection between the first test point 25 and the second test point 26. It is again the case here that the signal U to be transmitted is modified into a modified signal Uv.

FIG. 4 shows a further exemplary embodiment for detecting ingress of a viscous medium into an electronic assembly. In this case, the two electrical conductors 21 and 22 are each connected to a measurement pin 27, 28. The measurement pins are designed here such that in the event of ingress of a viscous medium into the electronic assembly 10, they come into contact with the viscous medium first. If the measurement pins 27, 28 make contact with the viscous medium 18 then the electrical signal U to be transmitted is likewise modified into a modified electrical signal Uv.

Figure 5:
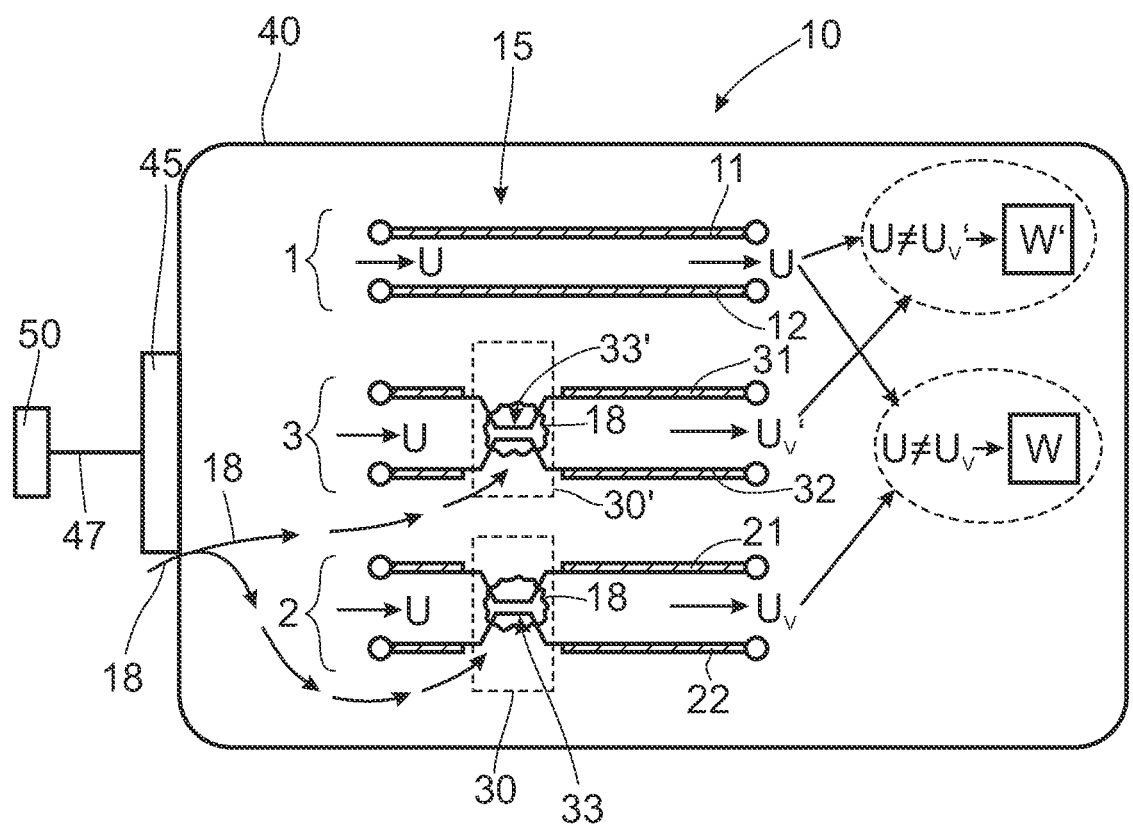
FIG. 5 shows a variant according to the invention.

FIG. 5 shows a method and structure for detecting ingress of a viscous medium into an electronic assembly as already described in FIG. 1, although in this case there are three redundant transmission paths for an electrical signal U. In this case, unlike FIG. 1, a third redundant transmission path 3 is present, which has a similar design to the redundant transmission path 2. The third redundant transmission path is arranged such that in the event of ingress of a viscous medium into the housing 40 or into the electronic assembly 10, the region 30 of the second transmission path 2 is reached first. As already described, on contact being made by the viscous medium 18 in the region 30 at the bridging point 33, the electrical signal U is modified into the modified signal Uv. By means of the already described comparison with the transmission of the electrical signal U via the first transmission path 1, a warning signal W is produced in the event that an unequal transmission signal U does not equal Uv. As already described, the warning signal W indicates that a viscous medium has penetrated into the electronic assembly. If there is further ingress of the viscous medium 18 into the electronic assembly 10, then as a result of the position of the third transmission path 3, on the viscous medium reaching the region 30' of the third transmission path 3, a short-circuit is likewise produced between the first electrical conductor 31 and the second electrical conductor 32 of the third transmission path 3. When this happens, the short-circuit at the bridging point 33' modifies the electrical signal U in the third transmission path 3 into the modified electrical signal Uv'. Then once again a comparison is made between the electrical signal U of the first transmission path 1 and the electrical signal Uv' of the third transmission path 3. If it is the case that U does not equal Uv', a further warning signal W' is produced. Weighting of the warning signal can be performed in this process, more precisely by this arrangement and by this method. For example, if only the warning signal W is present, then ingress of a viscous medium 18 into the electrical assembly 10 is detected, and a visit to a garage is advised for example in this case. If the warning signal W' occurs, this indicates that there is further ingress of a viscous medium 18 into the electronic assembly 10, and it is urgently advised to visit a garage, for example, or to bring the vehicle into a safe condition or to a standstill. Obviously it should be noted here that this redundancy can be increased as required, although redundancy in duplicate or triplicate, as described in FIGS. 1 and 5, is deemed practical. It should be noted overall that the aim of the invention is to use existing components to detect ingress of a viscous medium into an electronic assembly, with redundancy ensuring that the electrical assembly is still guaranteed to function.

REFERENCE SIGNS 1 first transmission path
2 second transmission path
10 electronic assembly
11 first electrical conductor
12 second electrical conductor
15 printed circuit board
18 viscous medium
21 first electrical conductor 22 second electrical conductor
25 first test point
26 second test point
27 measurement pins
28 measurement pins
30 region
30' region
31 first electrical conductor
32 second electrical conductor
33 bridging point
33' bridging point
40 housing
45 connection region
47 connection
50 electrical/electronic assembly
U electrical signal
Uv modified signal
Uv' modified signal
W warning signal
W' warning signal

The invention claimed is:

1. A method for detecting ingress of a liquid medium into an electronic assembly for a vehicle, which electronic assembly comprises at least a housing, a printed circuit board and a connection region, which housing provides an enclosure for the electronic assembly, with redundancy being provided with regard to at least one of processing and transfer of electrical signals by means of the printed circuit board in the electronic assembly, which redundancy provides at least a first transmission path and a second transmission path, which is operatively parallel thereto, each transmission path including at least a first electrical conductor and a second electrical conductor, which electrical conductors are electrically insulated from each other, wherein the first transmission path and the second transmission path transfer an identical electrical signal, wherein the second transmission path provides a region, in which region the first electrical conductor of the second transmission path and the associated second electrical conductor of the second transmission path have no insulation, and therefore in the event of ingress of the liquid medium into the electronic assembly, the electrical signal that is transferred through the electrical conductors of the second transmission path is modified to a modified electrical signal, the method comprising
comparing the electrical signal transferred through the second transmission path with the electrical signal transferred through the first transmission path, and
producing a warning message if the electrical signal transferred through the first transmission path differs from the electrical signal transferred through the second transmission path.

2. The method as claimed in claim 1, wherein the first transmission path is offset in parallel with the second transmission path.

3. The method as claimed in claim 1, wherein the region is positioned such that the liquid medium penetrating into the electronic assembly is directed to the region of the second transmission path.

4. The method as claimed in claim 1, wherein the first and second electrical conductors of the second transmission path provide a bridging point at the region.

5. The method as claimed in claim 4, wherein the bridging point is formed by the first and second electrical conductors of the second transmission path being spaced closer to each other than the first and second electrical conductors of the second transmission path are spaced from each other outside the region.

6. The method as claimed in claim 4, wherein the bridging point is formed by a first test point and a second test point, with the first test point connected to the first electrical conductor in an electrically conducting manner, and the second test point connected to the second electrical conductor in an electrically conducting manner.

7. The method as claimed in claim 1, wherein the electrical conductors are at least one of conductor tracks on the printed circuit board, electrical cables, and plug-in contacts located inside the housing.

8. The method as claimed in claim 1, wherein the connection region comprises at least one electrically conducting connection in order to connect the electronic assembly to a further electrical electronic assembly.

9. The method as claimed in claim 8, wherein the electrically conducting connection is designed as a current-conducting cable or as a plug-in connection.

10. The method as claimed in claim 8, wherein the further electrical assembly is a steering assembly or a wheel brake or a radar assembly or a lidar assembly.

11. The method as claimed in claim 1, wherein the redundancy provides at least a third transmission path, which third transmission path provides at least a first electrical conductor and a second electrical conductor, with the third transmission path provided between the first transmission path and the second transmission path, wherein the third transmission path transfers the identical electrical signal.

12. The method as claimed in claim 11, wherein the third transmission path is similar in design to the second transmission path, with the following provided in the event of ingress of the liquid medium into the electronic assembly:
   a) if there is further ingress of a liquid medium into the electronic assembly, then in the third transmission path, the further ingress of liquid medium modifies the electrical signal transferred through the third transmission path in a region in which a first electrical conductor of the third transmission path and a second electrical conductor of the third transmission path have no insulation into a second modified signal;
   b) comparing the electrical signal transferred through the first transmission path with the electrical signal transferred through the third transmission path; and
   c) if the electrical signal transferred through the first transmission path differs from the electrical signal transferred through the third transmission path, an additional warning signal is produced.

13. The method as claimed in claim 1, wherein the liquid medium comprises at least one of water, an oil, an emulsion, a lubricant a cleaning agent, an acid and a hydraulic fluid.

14. The method as claimed in claim 1, wherein the first transmission path is at an angle to the second transmission path.

15. The method as claimed in claim 1, wherein the first transmission path and the second transmission path transmit signals for the function of the electronic assembly.

16. The method as claimed in claim 1, wherein the first transmission path and the second transmission path transmit the same signal simultaneously to provide redundancy.

17. A method for detecting ingress of a liquid medium into a housing of an electronic assembly for a vehicle, the method comprising:
transferring an electronic signal through a first transmission path on a printed circuit board in the housing of the electronic assembly, the first transmission path having first and second electrical conductors electrically insulated from each other;

transferring the electronic signal through a second transmission path on the circuit board of the electronic assembly, the second transmission path having first and second electrical conductors electrically insulated from each other and being operatively parallel to the first transmission path;

directing the liquid medium to a region in which the first and second electrical conductors of the second transmission path have no insulation to modify the electrical signal transferred through the second transmission path to a modified electrical signal;

comparing the electronic signal transferred through the first transmission path to the electrical signal transferred through the second transmission path; and producing a warning message if the electrical signal transferred through the first transmission path differs from the electrical signal transferred through the second transmission path.

18. The method as claimed in claim 17, wherein the first and second electrical conductors of the second transmission path are spaced closer to each other in the region than the first and second electrical conductors of the second transmission path are spaced from each other outside the region.

\* \* \* \* \*